April 5, 1960 E. J. H. BUSSARD 2,931,988

TRANSISTORIZED ALTERNATING CURRENT AMPLIFIER WITH GAIN CONTROL

Original Filed April 2, 1957

INVENTOR.
EMMERY J. H. BUSSARD.
BY Alden D. Redfield
Irwin P. Garfinkle
ATTORNEYS.

United States Patent Office 2,931,988

Patented Apr. 5, 1960

2,931,988

TRANSISTORIZED ALTERNATING CURRENT AMPLIFIER WITH GAIN CONTROL

Emmery J. H. Bussard, Cincinnati, Ohio, assignor to Avco Manufacturing Corporation, Cincinnati, Ohio, a corporation of Delaware Continuation of application Serial No. 650,168, April 2, 1957. This application October 1, 1959, Serial No. 843,817

4 Claims. (Cl. 330—18)

This invention relates to a transistorized, multi-stage amplifier employing automatic gain control and, more particularly, to a medium high and very high frequency amplifier of the type used in the intermediate frequency stage of a superheterodyne receiver.

This application is a continuation of my patent application, Serial No. 650,168, filed April 2, 1957, also entitled "Transistorized Alternating Current Amplifier With Gain Control" and assigned to the same assignee as the present application and invention.

Many systems are shown in the prior art for applying automatic gain control to an intermediate frequency stage of a superheterodyne receiver using vacuum tubes and, as is well known, gain control is achieved normally by varying the D.C. bias voltage on the amplifier tube's grid. This requires very little D.C. power because the grid, being negative with respect to the cathode, draws little or no current. On the other hand, a transistor is a current-operated device, and to control gain, a considerable amount of current must be supplied to the transistor from the source of automatic gain control power. This means that a considerable amount of the useful output of a transistorized superheterodyne receiver system must be expended for automatic gain control and, therefore, it is a primary object of this invention to provide a system of automatic gain control which uses a very low power drive.

Another object of this invention is to provide a stable, self-adjusting, transistorized, alternating current amplifier system which can be gain-controlled automatically and simply for a very wide range of signals and by means of a very low power drive.

Another object of this invention is to provide a transistorized, multi-stage amplifier circuit which allows the individual transistors to seek and establish their best operating conditions in the system so that transistors with wide commercial tolerances can be used to the best advantage.

Another object of the invention is to provide a transistorized amplifier which will have improved operating efficiency and which will be better adapted economically for moderately high voltage supplies, such as the 28-volt D.C. power supply used in aircraft.

Another object of this invention is the provision of circuitry which will achieve the desired stabilization of a multi-stage transistorized amplifier so that gain control and other circuit adjustments may be made automatically.

Still another object of the invention is the provision of a simple and inexpensive alternating current frequency amplifier system which is readily adaptable to mass production assembly methods.

Further objects and advantages and a more complete understanding of this invention may be had by reference to the following detailed description and to the accompanying drawing, in which.

Figures 1, 2:
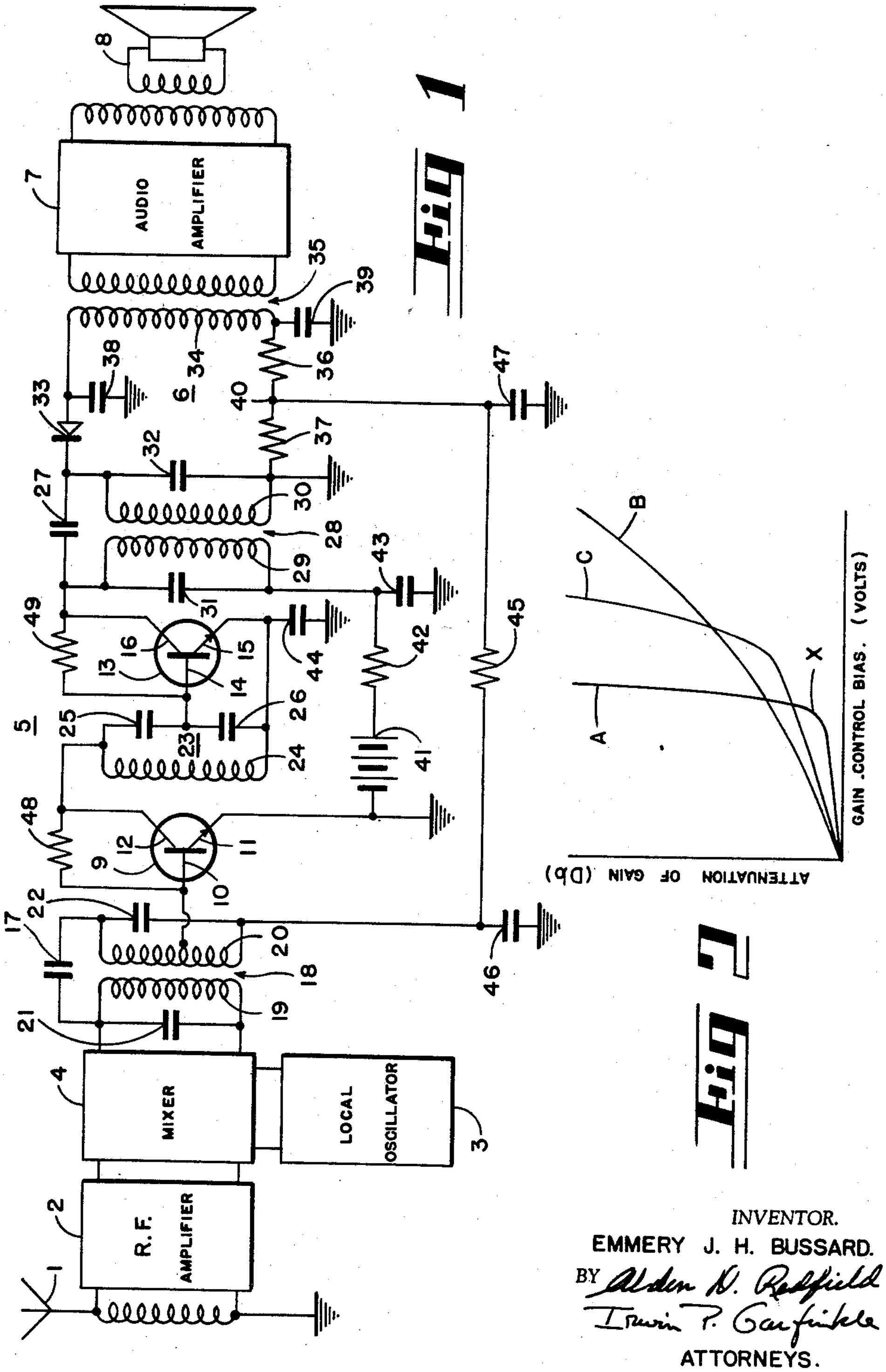
Fig. 1 represents a preferred embodiment of my invention.
Fig. 2 is a series of curves representing the bias-gain characteristics of my amplifier system as compared with the prior art.

Referring to Fig. 1, the high frequency amplifier and control element which constitutes my invention is illustrated as the intermediate frequency stage of a superheterodyne receiver, which is shown partly in block diagram form. The receiver system includes a conventional antenna circuit 1, a radio frequency amplifier 2 and a local oscillator 3. The radio frequency signals and the local oscillator signals are heterodyned in a conventional manner in a mixer 4 to produce an intermediate frequency signal which is applied to my multi-stage, transistorized amplifier 5. After amplification in the intermediate frequency stage 5, the signal is detected in a detector circuit 6 from which an AGC source is derived, and the detected signal is then applied to a conventional audio amplifier 7 and a loudspeaker system 8.

In general, my transistorized, intermediate frequency amplifier 5 is a two-stage, common emitter type employing NPN junction transistors which are cascaded for A.C. operation but are series-connected for D.C. operation. This means that for A.C., the collector output of the first stage is applied to the base of the second stage, while for D.C. the biasing voltage is applied to the two stages in series, and each stage operates at approximately one-half of the total supply bias. As a result of the series arrangement for direct currents, the D.C. gain of the first stage is used to control the second stage and, therefore, AGC power is required at only the first stage. With the series D.C. arrangement no more AGC power is required for the control of the two or more stages than is required for a single stage. In addition, the invention provides an operating, self-biasing network which allows each transistor to seek its own level under the effects of AGC and other variations and, thus, "stretch" the AGC characteristics of the amplifier. The self-biasing arrangement does cause some power loss, but the gain response is spread to allow for smoother amplifier operation.

As illustrated in Fig. 1, the preferred embodiment of my multi-stage amplifier 5 comprises a first stage, junction type transistor 9 having a base 10, an emitter 11 and a collector 12, and a second stage, junction type transistor 13 having a base 14, an emitter 15 and a collector 16. While NPN type transistors are preferred, since simpler circuitry is permitted, it is to be understood that either an NPN or a PNP type may be used successfully. Furthermore, while only two stages of amplification are illustrated, the operating principles of this invention can be applied to any reasonable number of amplifier stages and the system can be expanded into triplets, quadruplets, etc., equally well.

A most economical system in a high-gain, broadband amplifier operating on a 28-volt supply might consist of a six-stage amplifier operated either as two groups of three stages or as three groups of two stages, each group of stages being series-connected for direct currents. In such cases the AGC drive would be applied in parallel to only one stage in each group for full automatic control of all the stages.

Each of the transistors 9 and 13 is connected common emitter for both A.C. and D.C. operation, i.e., the A.C. and D.C. inputs to each transistor are between its emitter and the base, and the outputs are taken from between its emitter and the collector. It is to be understood that for A.C. operation the transistors may also be arranged common base and common collector and, moreover, the amplifier can be inverted, i.e., the A.C. output for mixer 4 could be applied to the transistor 13 first and then to transistor 9. However, for D.C. operation the common emitter configuration is preferred, since a high beta is required for best results.

The intermediate frequency output from the mixer 4 is coupled to the base 10 of transistor 9 through a condenser 17 and a conventional double-tuned network 18. The network 18 comprises inductors 19 and 20 which are tuned to the intermediate frequency by the condensers 21 and 22, respectively. After amplification in the transistor 9, the intermediate frequency is then coupled to a single-tuned circuit 23 comprising the inductor 24 and the two condensers 25 and 26. The intermediate frequency is applied from the junction of condensers 25 and 26 to the input circuit of transistor 13 between its base 14 and its emitter 15.

After a second amplification in the transistor 13, the intermediate frequency signal is coupled to the detector circuit 6 through a condenser 27 and a double-tuned network 28 comprising the inductors 29 and 30, which are tuned by the condensers 31 and 32, respectively. The operation and advantages of the detector circuit 6 are fully disclosed and claimed in the copending application of Thomas B. Horgan, Serial No. 635,623, filed on January 23, 1957, and assigned to the same assignee as this invention. It comprises a rectifier 33 connected in circuit with the primary winding 34 of an audio frequency transformer 35 and two D.C. resistors 36 and 37. The condenser 38 is provided as an intermediate frequency by-pass for the audio frequency transformer 35 and the condenser 39 is provided as an audio frequency by-pass for the D.C. resistors 36 and 37. With the polarities indicated, the junction 40 between the resistors 36 and 37 provides a variable, negative-going direct current source which constitutes a very convenient supply of automatic gain control power.

As thus far described, it has been shown how the transistors 9 and 13 are cascaded for A.C. operation. The following description relates to the arrangement of the D.C. circuit in connection with the transistors 9 and 13. It will be seen that for direct currents the transistors 9 and 13 are series-connected or "cascoded."

The D.C. bias for the amplifier 5 is supplied from a battery 41 or any other suitable B+ supply to both of the transistors 9 and 13 which are connected in series for direct current. The series D.C. circuit of transistors 9 and 13 may be traced from the positive side of the battery 41 through a D.C. load resistor 42 and the inductor 29, through the collector 16 and the emitter 15 of the transistor 13 and the inductor 24, and through the collector 12 and the emitter 11 of the transistor 9 to the negative side of the battery 41. The size of the D.C. load resistor 42 governs the rate of gain control to a considerable degree. Intermediate frequency components in inductor 29 are by-passed from the D.C. circuit by means of the condenser 43, and the D.C. circuit is blocked from ground at the emitter 15 of transistor 13 by means of the condenser 44 which serves to ground the emitter at A.C. In operation, the transistors 9 and 13 are arranged so that approximately equal bias is initially effective across the emitter-collector circuit of each transistor, although in some applications it may be desirable to operate the amplifier so that the output transistor 13 has a little higher bias than the transistor 9.

Automatic gain control power is applied from the source available at the junction 40 in the detector circuit 6 to the amplifier 5 at transistor 9, the connection being made through the resistor 45 and through a portion of the inductor 20 to the transistor base 10. The condenser 46 provides an A.C. path to ground for the alternating current components flowing through the inductors 20 while the condenser 47 provides a by-pass for A.C. currents flowing in the detector 6. Thus, the first-stage transistor 9 is controlled by the application of AGC power, and the control exercised on the first stage functions automatically to control the second and any other succeeding stages. For a purpose to be hereinafter explained, a self-biasing resistor 48 is provided for the collector-base circuit of transistor 9, and a similar resistor 49 is provided for the collector-base circuit of transistor 13.

When no AGC power is applied to the base 10 of transistor 9, the amplifier 5 is arranged to operate at full gain, as determined by the value of the self-biasing resistors 48 and 49. The application of negative-going gain control drive reduces the effective bias between the base 10 and emitter 11 of the first-stage transistor 9, thus reducing emitter current and corresponding gain. This causes the voltage between the collector 12 and the emitter 11 to rise. The rise in voltage across transistor 9 causes a corresponding decrease in voltage across the collector 16 and the emitter 15 of the transistor 13, thereby reducing the gain of the second stage. Therefore, by varying the major portion of the direct current through the transistor 9 by the application of automatic gain control the transistor 9 behaves effectively as a variable resistance in D.C. series with the transistor 13. As the effective resistance is varied, the current through the transistor 13 and any other transistors which may also be connected in the D.C. string is also varied. The initial conditions are established such that the first stage tends to lose gain faster than the succeeding stage or stages so that a good drive for the later stages is provided. It is noted that the resistor 45, in conjunction with the D.C. load resistor 37 in the detector affects the initial bias on the amplifier system and on the detector. In selecting the value of the self-biasing resistors 48 and 49 for initial adjustment, the values of resistors 45 and 37 are significant, although not critical.

The self-biasing resistors 48 and 49 have each been provided for the purpose of biasing each transistor in accordance with the operating collector potential and thereby causing the transistors to seek and establish the best operating conditions. The base 10 of transistor 9 is biased by means of a resistor 49 which provides a feedback circuit from the collector 12 to the base 10, while the base 14 of transistor 13 is biased by means of the resistor 49 which provides a feedback circuit from the collector 16 to the base 14. These feedback connections bias each of the bases 10 and 14 at the potential of the collectors, less the voltage drop across the respective self-biasing resistors 48 and 49. The voltage drop in resistor 49 is due wholly to the base current flowing in transistor 13, since the only D.C. path through resistor 49 is through the base 14; however, the D.C. path through resistor 48 branches through the base 10 and through the resistors 45 and 37. Initially, the resistance of the path through the resistors 45 and 37 is high, compared to that of the transistor-base-emitter diode, but the two paths approach each other in resistance as the transistor 9 is biased toward cutoff. As a result, it will be seen that the AGC characteristic of the transistors will be "stretched" to provide a smooth and uniform control over a very wide range of signal levels.

Resistances 48, 45, 37, 36, and the base-emitter resistance of transistor 9 function as a "flexible" voltage divider controlling the bias of base 10. Resistance 49 and the base-emitter resistance of transistor 13 function similarly to bias the base 14. (For the purpose of minimizing the effects of the internal resistance of the transistors 9 and 13, the resistors 45, 48, and 49 are made relatively large.) The increase in voltage at the collector 12 caused by the application of gain control causes an increase in current in the self-biasing resistor 48 such that the AGC action is opposed, thereby retarding the control and producing smoother AGC characteristics. Similarly, the voltage drop at the collector 16 causes a decreased current flow in resistor 49, thereby also tending to oppose and retard the AGC. Thus, it is seen that the stages are free to float voltage-wise and automatically assume new levels of operation as the current in the first stage is varied by the application of automatic gain control power. This not only tends to control the gain in both stages, but also stretches the bias-gain characteristic of the system to make the portion of the curve available where the rate of change favors the smoothest control action.

An understanding of the effects and advantages of the automatic gain control when applied in conjunction with the cascoded, direct current, self-biasing arrangement may be had from a study of the curves A and B in Fig. 2, to which reference is now made. The coordinates of the curves are attenuation of gain (the loss of gain expressed in db) and gain control bias (the amount of control bias expressed in volts) applied to the controlled amplifiers from the gain control source.

The curve A represents a single transistor supplied with gain control bias in a conventional manner. It is noted that smooth operation occurs on the relatively linear portion of the curve up to the point X. Beyond that point the rate of change becomes too fast for practical control. The curve B represents the cooperation of the two-stage amplifier system arranged in accordance with my invention, i.e., with the transistors cascoded for D.C. and with the use of the feedback resistors 48 and 49. It is seen that the curve is made relatively linear over a much greater range of amplifier operation and, thus, a smooth and uniform control action is achieved over a wide range. In addition, the power requirement per stage of the amplifier represented by the curve B is much lower than the prior art amplifier represented by the curve A. This is because the application of gain control power to a prior art arrangement greatly reduces the resistance of the diode junction of the transistor, and, therefore, power consumption becomes very high.

Where large ranges of gain control are needed, gain control power can be applied from the junction 40 to the base 14 of the transistor 13 instead of to the base 10 of the transistor 9. In this manner, the second-stage transistor 13 becomes a high-gain driver of the first-stage transistor 9 such that the first-stage gain is reduced much faster than the second. The results of this arrangement are indicated by the curve C in Fig. 2. It is noted that as gain control voltage is increased, the attenuation of gain is much faster than that in the embodiment of Fig. 1 (curve B). However, as compared to the prior art curve A, the gain control characteristic of amplifier represented by curve C has been "stretched" considerably, and less gain control power per stage is required.

In one practical embodiment of my invention developed for commercial use and arranged in accordance with Fig. 1, the following circuit parameters were used:

| | | |
|---|---|---|
| Transistor 9 | | Type 2N94 |
| Transistor 13 | | Type 2N94 |
| Condenser 21 | $\mu\mu$f | 250 |
| Condenser 22 | $\mu\mu$f | 250 |
| Condenser 25 | $\mu\mu$f | 250 |
| Condenser 26 | $\mu\mu$f | 1500 |
| Inductor 19 | $\mu$h | 490 |
| Inductor 20 | $\mu$h | [1] 490 |
| Resistor 42 | ohms | 320 |
| Resistor 45 | do | 68K |
| Resistor 48 | do | 390K |
| Resistor 49 | do | 390K |
| Battery 41 | volts | 9 |
| Inductor 24 | $\mu$h | 520 |

[1] Tapped at 9%.

With the above parameters and with good R-C filtering, a net voltage of 7.8 volts was impressed from the collector 16 of the second-stage transistor 13 to the emitter 11 of first-stage transistor 9. The biases were established such that 3.4 volts appeared between the emitter 11 and the collector 12 of the first stage and about 4.4 volts between the emitter 15 and the collector 16 of the second stage. About 0.6 ma. D.C. flowed in the system and, of this, about 2 to 3 microamperes flowed in the gain control system, including the resistor 45.

It is to be understood that while specific circuit parameters are indicated, the parameters are merely illustrative and it is not intended that the invention be limited thereby. Moreover, while double-tuned networks 18 and 28 are illustrated in the preferred embodiment, single-tuned couplers may be used and are preferred in a practical arrangement where selectively requirements permit. In addition, while a common emitter configuration is employed, it is noted that common base or common collector configurations may be used in the several stages by such appropriate alterations in the circuitry as are well known in the art.

It is seen, therefore, that I have provided a self-adjusting, stable, alternating current frequency amplifier which is adapted for full automatic gain control, and which minimizes the power losses due to gain control. Although my amplifier has been illustrated as an intermediate frequency amplifier, it is to be understood that it will find utility in any frequency range within the limits of operation of the transistor.

What I claim as my invention:

1. In a transistorized alternating current, multi-stage amplifier, the combination comprising: a first amplifier stage comprising a first transistor having a first base, a first collector and a first emitter, said first transistor having a first alternating current input circuit and a first alternating current output circuit; a second amplifying stage comprising a second transistor having a second base, a second collector and a second emitter, said second transistor having a second alternating current input circuit and a second alternating current output circuit, said second alternating current input circuit being coupled to said first alternating current output circuit for translation of alternating currents; a high impedance detector; means coupling said second alternating current output circuit to said detector for translation of alternating currents; means for deriving a direct current gain control signal from said detector; a direct current load element for said second collector; a source of direct current potential, said source being connected in a direct current closed series loop including said direct current load element, said second collector, said second emitter, said first collector and said first emitter, in the order named, the connection of said source in said loop providing the sole fixed reference bias for said transistors; means for self-biasing said first base comprising a first resistor connected from said first collector to said first base; means for self-biasing said second base comprising a second resistor connected from second collector to said second base; and means coupling said automatic gain control signal across the emitter and base of one of said transistors.

2. The combination of a first transistor having a first base, emitter and collector, a second transistor having a second base, emitter and collector, said transistors being amplifier stages, a low power detector providing a source of automatic gain control currents, a source of direct currents, a direct current load element for the second collector, connections for completing a closed direct current series circuit comprising said source of direct currents, the first collector and emitter, the second collector and emitter, and said element, said source having terminals and said first emitter and said element being connected to said terminals to provide the sole fixed reference potential points in said circuit; means for cascading said transistors for alternating currents, a first biasing resistor between the first collector and the first base and a second biasing resistor between the second collector and the second base, and a gain control connection between said source of gain control currents and said first base.

3. The combination of a first transistor having a first base, emitter and collector, a second transistor having a second base, emitter and collector, said transistors being amplifier stages, a low power detector providing a source of automatic gain control currents, a source of direct currents, a direct current load element for the second collector, connections for completing a closed direct current series circuit comprising said source of direct currents, the first collector and emitter, the second collector and emitter, and said element; means for cascading said transistors for alternating currents, a first biasing resistor between the first collector and the first base and a second biasing resistor between the second collector and the second base, and a gain control connection between said source of gain control currents and said first base.

4. The combination of a cascaded alternating current amplifier and a cascoded direct current amplifier comprising a first transistor having a first base, emitter and collector, a second transistor having a second base, emitter and collector, said transistors being cascaded for alternating current amplification, a source of automatic gain control currents, a source of direct currents, a direct current load element for said second collector, connections for completing a closed direct current series circuit comprising said source of direct currents, said first emitter and collector, said second emitter and collector, and said load element; a first biasing resistor between the first collector and the first base, and a second biasing resistor between the second collector and the second base, and a gain control connection between said source of gain control currents and said first base.

References Cited in the file of this patent

UNITED STATES PATENTS 2,831,968 Stanley ---------------- Apr. 22, 1958

FOREIGN PATENTS 201,034 Australia ------------- Feb. 22, 1956